United States Patent
Lau

(10) Patent No.: US 11,339,469 B2
(45) Date of Patent: May 24, 2022

(54) VACUUM PROCESSING SYSTEM WITH HOLDING ARRANGEMENT

(71) Applicant: Applied Materials, Inc., Santa Clara, CA (US)

(72) Inventor: Simon Lau, Alzenau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/772,979

(22) PCT Filed: Jan. 13, 2016

(86) PCT No.: PCT/EP2016/050525
§ 371 (c)(1),
(2) Date: May 2, 2018

(87) PCT Pub. No.: WO2017/121467
PCT Pub. Date: Jul. 20, 2017

(65) Prior Publication Data
US 2018/0320264 A1    Nov. 8, 2018

(51) Int. Cl.
*C23C 14/50* (2006.01)
*B65G 49/06* (2006.01)
(Continued)

(52) U.S. Cl.
CPC ............ *C23C 14/50* (2013.01); *B65G 49/062* (2013.01); *C23C 16/4581* (2013.01); *H01L 21/6838* (2013.01); *H01L 21/6875* (2013.01)

(58) Field of Classification Search
CPC . C23C 14/0021; C23C 14/0036; C23C 14/50; C23C 16/458; C23C 16/4581;
(Continued)

(56) References Cited

U.S. PATENT DOCUMENTS 3,707,452 A * 12/1972 Lester ................. B65H 18/021
204/192.22
5,191,218 A * 3/1993 Mori ....................... G03F 7/707
250/453.11
(Continued)

FOREIGN PATENT DOCUMENTS

CN       1885169 A     12/2006
CN       1885196 A     12/2006
(Continued)

OTHER PUBLICATIONS

English machine translation of JP-2014-205205A (Tatsumi) (Year: 2014).*
(Continued)

*Primary Examiner* — Benjamin Kendall
*Assistant Examiner* — Kurt Sweely
(74) *Attorney, Agent, or Firm* — Patterson + Sheridan, LLP

(57) ABSTRACT

The present disclosure provides a holding arrangement. The holding arrangement for holding a substrate includes: a body portion having a first side; a dry adhesive material provided on the first side of the body portion; a seal surrounding the dry adhesive material and configured to provide a vacuum region on the first side, wherein the dry adhesive material is provided in the vacuum region; and a conduit to evacuate the vacuum region.

5 Claims, 6 Drawing Sheets

(51) Int. Cl.
  *H01L 21/683* (2006.01)
  *H01L 21/687* (2006.01)
  *C23C 16/458* (2006.01)

(58) Field of Classification Search
  CPC ............ C23C 16/4582; C23C 16/4583; C23C 16/4584; C23C 16/4586; H01L 21/683; H01L 21/6838; H01L 21/687; H01L 21/6875; H01L 21/68714; H01L 21/68742; H01L 21/68785; H01J 37/32431; H01J 37/32715; H01J 37/34; H01J 37/3411; H01J 37/3435; B65G 49/062; B65G 49/067; B65G 2249/045; B23Q 3/084
  See application file for complete search history.

(56) References Cited

U.S. PATENT DOCUMENTS

| | | | | |
|---|---|---|---|---|
| 6,196,532 | B1 * | 3/2001 | Otwell .................. | B25B 11/005 269/21 |
| 6,394,797 | B1 * | 5/2002 | Sugaya ............. | H01L 21/67103 432/253 |
| 8,206,631 | B1 * | 6/2012 | Sitti ........................ | B29C 39/10 264/255 |
| 2006/0213599 | A1 | 9/2006 | Knowles et al. | |
| 2008/0025822 | A1 | 1/2008 | Kim et al. | |
| 2009/0011232 | A1 | 1/2009 | Dai et al. | |
| 2012/0107570 | A1 | 5/2012 | Ross et al. | |
| 2014/0191478 | A1 * | 7/2014 | Oremus .............. | H01L 21/6838 279/3 |
| 2016/0303871 | A1 * | 10/2016 | Bouwens ............... | B41J 11/007 |
| 2017/0129717 | A1 * | 5/2017 | Herman ............. | H05K 13/0818 |

FOREIGN PATENT DOCUMENTS

| | | |
|---|---|---|
| JP | 2007-73892 A | 3/2007 |
| JP | 2014/205205 A | 10/2014 |
| JP | 2014205205 A * | 10/2014 |
| KR | 20070090839 A | 9/2007 |
| TW | 201329648 A | 7/2013 |
| TW | 201426904 A | 7/2014 |
| TW | 201519362 A | 5/2015 |
| TW | 201533838 A | 9/2015 |

OTHER PUBLICATIONS

"Switchable Adhesion in Vacuum Using Bio-Inspried Dry Adhesives". Julia Purtov, Mareike Frensemeier, and Elmar Kroner ACS Applied Materials & Interfaces 2015 7 (43), 24127-24135 (DOI: 10.1021/acsami.5b07287) (Year: 2015).*
International Search Report and Written Opinion dated Sep. 7, 2016 for Application No. PCT/EP2016/050525.
Chinese Office Action dated Aug. 19, 2019 for Application No. 201680075367.7.
Japanese Office Action dated Aug. 13, 2019 for Application No. JP 2018-536105.
Taiwan Office Action dated Jan. 31, 2020 for Application No. 105134332.
Korean Office Action dated Mar. 2, 2020 for Application No. 10-2018-7018728.
Chinese Notice of Allowance dated Jun. 2, 2021 for Application No. 201680075367.7.

* cited by examiner

VACUUM PROCESSING SYSTEM WITH HOLDING ARRANGEMENT

FIELD

Embodiments of the present disclosure relate to a holding arrangement for holding a substrate, a carrier for supporting a substrate, a vacuum processing system, a method for holding a substrate, and a method for releasing a substrate. Embodiments of the present disclosure particularly relate to a holding arrangement for holding a substrate during substrate processing in a vacuum processing chamber, a carrier for supporting a substrate in a vacuum processing chamber, a vacuum processing system including a vacuum processing chamber, a method for holding a substrate during substrate processing in a vacuum processing chamber, and a method for releasing a substrate after substrate processing in a vacuum processing chamber. Specifically, substrate processing can include a deposition process, such as a sputter deposition process.

BACKGROUND

Techniques for layer deposition on a substrate include, for example, thermal evaporation, chemical vapor deposition (CVD) and physical vapor deposition (PVD) such as sputtering deposition. A sputter deposition process can be used to deposit a material layer on the substrate, such as a layer of an insulating material. During the sputter deposition process, a target having a target material to be deposited on the substrate is bombarded with ions generated in a plasma region to dislodge atoms of the target material from a surface of the target. The dislodged atoms can form the material layer on the substrate. In a reactive sputter deposition process, the dislodged atoms can react with a gas in the plasma region, for example, nitrogen or oxygen, to form an oxide, a nitride or an oxinitride of the target material on the substrate.

Coated materials can be used in several applications and in several technical fields. For instance, coated materials may be used in the field of microelectronics, such as for generating semiconductor devices. Also, substrates for displays can be coated using a PVD process. Further applications include insulating panels, organic light emitting diode (OLED) panels, substrates with thin film transistors (TFTs), color filters or the like.

The tendency toward larger and also thinner substrates can result in bulging of the substrates due to stress applied to the substrate, e.g., during a deposition process. Support systems which hold a substrate during a deposition process introduce bulging on the substrate, e.g., due to forces that push the substrate edge towards the center of the substrate. Bulging can, in turn, cause problems due to the increasing likelihood of breakage. Accordingly, there is a need to reduce bulging and to support bigger and thinner substrates without damage or breakage.

In view of the above, new holding arrangements for holding a substrate during substrate processing in a vacuum processing chamber, carriers for supporting a substrate in a vacuum processing chamber, vacuum processing systems, methods for holding a substrate, and methods for releasing a substrate, that overcome at least some of the problems in the art, are beneficial.

SUMMARY

In light of the above, a holding arrangement for holding a substrate, a carrier for supporting a substrate, a vacuum processing system, a method for holding a substrate, and a method for releasing a substrate are provided. Further aspects, benefits, and features of the present disclosure are apparent from the claims, the description, and the accompanying drawings.

According to an aspect of the present disclosure, a holding arrangement for holding a substrate, specifically during substrate processing in a vacuum processing chamber, is provided. The holding arrangement includes a body portion having a first side; a dry adhesive material provided on the first side of the body portion; a seal surrounding the adhesive and configured to provide a vacuum region on the first side, wherein the dry adhesive material is provided in the vacuum region; and a conduit to evacuate the vacuum region.

According to a further aspect of the present disclosure, a holding arrangement for holding a substrate during substrate processing in a vacuum processing chamber is provided. The holding arrangement includes a body portion having a first side; a dry adhesive material provided on the first side of the body portion and comprising a plurality of filaments; a seal surrounding the adhesive and configured to provide a vacuum region on the first side, wherein the dry adhesive material is provided in the vacuum region; and a conduit to evacuate the vacuum region, wherein the conduit is configured to apply first negative pressure to the vacuum region to attach the substrate, and wherein the conduit is configured to apply a second negative pressure to the vacuum region to move the substrate closer to the body portion to buckle the plurality of filaments, releasing the substrate.

According to another aspect of the present disclosure, a carrier for supporting a substrate, specifically in a vacuum processing chamber, is provided. The carrier includes a carrier body, and one or more holding arrangements, wherein the one or more holding arrangements are mounted on the carrier body. The holding arrangement includes a body portion having a first side; a dry adhesive material provided on the first side of the body portion; a seal surrounding the adhesive and configured to provide a vacuum region on the first side, wherein the dry adhesive material is provided in the vacuum region; and a conduit to evacuate the vacuum region.

According to a further aspect of the present disclosure, a vacuum processing system is provided. The vacuum processing system includes a carrier. The carrier includes a carrier body, and one or more holding arrangements, wherein the one or more holding arrangements are mounted on the carrier body. The holding arrangement includes a body portion having a first side; a dry adhesive material provided on the first side of the body portion; a seal surrounding the adhesive and configured to provide a vacuum region on the first side, wherein the dry adhesive material is provided in the vacuum region; and a conduit to evacuate the vacuum region.

According to an aspect of the present disclosure, a method for holding a substrate with at least one holding arrangement including a dry adhesive material is provided. The method includes applying a first negative pressure to a vacuum region of the at least one holding arrangement for attaching a substrate to the at least one holding arrangement; moving the substrate through a vacuum processing chamber; and applying a second negative pressure to a vacuum region of the at least one holding arrangement for releasing the substrate from the at least one holding arrangement.

According to another aspect of the present disclosure, a method for releasing a substrate from at least one holding arrangement is provided. The method includes increasing the vacuum level in a vacuum region of the at least one holding arrangement to increase the force, with which the substrate is pressed onto a dry adhesive material, for releasing the substrate. Specifically, increasing the vacuum level in the vacuum region can be understood as reducing the pressure in the vacuum region.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
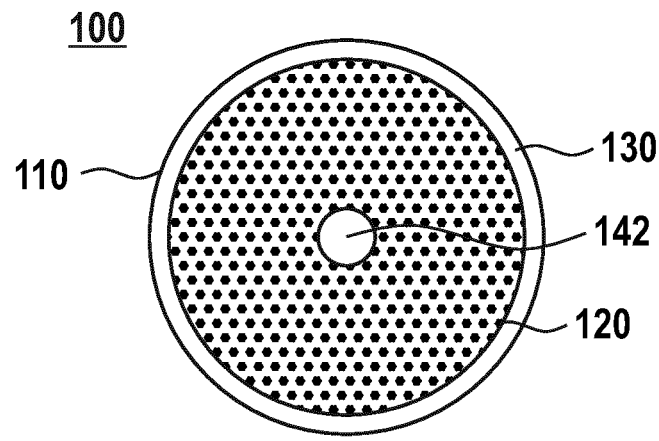
FIG. 1 shows a schematic top view of a holding arrangement for holding a substrate according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The tendency to larger and also thinner substrates can result in bulging of the substrates due to stress applied to the substrate, e.g., during a deposition process. Support systems such as clamps which hold a substrate during a deposition process introduce bulging on the substrate, e.g., due to forces that push the substrate edge towards the center of the substrate. Bulging can, in turn, cause problems due to the increased likelihood of breakage.

Further, clamps usually encompass a substrate, i.e. contact the substrate on two opposite surfaces of the substrate. For instance during a deposition process, a layer is deposited on one of these two surfaces. As the clamp covers a part of the substrate, a layer is not deposited on that part of the substrate. Furthermore, clamps can damage the substrate surface by mechanical contact. For instance, particles can be generated by the mechanical contact. Even in the case when no clamp is used during the deposition process, a mechanical contact of the deposited layer after the deposition process can damage the substrate. Hence, it can be beneficial to avoid mechanically contacting one surface of the substrate, specifically the surface of the substrate that is to be processed, particularly in a deposition process. When practicing some embodiments described herein, particles generated can be reduced.

The present disclosure can use a first negative pressure or first vacuum level to generate a first suction force to pull a substrate towards a dry adhesive material. Once contact has been made between the substrate and the dry adhesive material, the substrate can be held on the dry adhesive material by the adhesive force of the dry adhesive material. Specifically, the first negative pressure can be turned off when the contact between the substrate and the dry adhesive material has been established. For releasing the substrate, a second negative pressure or second vacuum level can be used to generate a second suction force to pull the substrate towards a dry adhesive material. The second suction force can be higher than the first suction force. Specifically, the substrate can be pressed closer onto the dry adhesive material which can lead to buckling of the dry adhesive material. The adhesive force of the dry adhesive material can be lower when the dry adhesive material is buckled and the substrate can be released. The substrate can be released from the dry adhesive material with reduced mechanical stress. Damage or breakage of the substrate can be prevented. Further, the dry adhesive material can reduce or even avoid a bulging when holding the substrate, e.g., a bulging due to forces that may push the substrate edge towards the center of the substrate. Furthermore, by pulling the substrate towards the dry adhesive material by a suction force, contacting of a surface of the substrate opposite to the dry adhesive material can be avoided. In particular, embodiments of the present disclosure can hold bigger and thinner substrates without damage or breakage.

The embodiments described herein can be utilized for evaporation on large area substrates, e.g., for display manufacturing. Specifically, the substrates or carriers, for which the structures and methods according to embodiments described herein are provided, are large area substrates. For instance, a large area substrate or carrier can be GEN 4.5, which corresponds to about 0.67 m² substrates (0.73×0.92 m), GEN 5, which corresponds to about 1.4 m² substrates (1.1 m×1.3 m), GEN 7.5, which corresponds to about 4.29 m² substrates (1.95 m×2.2 m), GEN 8.5, which corresponds to about 5.7 m² substrates (2.2 m×2.5 m), or even GEN 10, which corresponds to about 8.7 m² substrates (2.85 m×3.05 m). Even larger generations such as GEN 11 and GEN 12 and corresponding substrate areas can similarly be implemented.

The term "substrate" as used herein shall embrace inflexible substrates, e.g., plates, and flexible substrates such as a web or a foil. As an example, the substrate can have a thickness of less than 1 mm, specifically less than 0.7 mm, and more specifically less than 50 µm. As an example, the substrate can have a thickness in a range of 0.3 mm to 0.7 mm. According to some embodiments, the substrate can be made from any material suitable for material deposition. For instance, the substrate can be made from a material selected from the group consisting of glass (for instance soda-lime glass, borosilicate glass etc.), metal, polymer, ceramic, compound materials, carbon fiber materials, mica or any other material or combination of materials which can be coated by a deposition process.

FIG. 1 shows a schematic view of a holding arrangement 100 for holding a substrate, specifically during substrate processing in a vacuum processing chamber, according to embodiments described herein.

The holding arrangement 100 can include a body portion 110 having a first side 112. A dry adhesive material 120 can be provided on the first side 112 of the body portion 110. A seal 130 can surround the dry adhesive material 120 and can be configured to provide a vacuum region on the first side 112. The dry adhesive material 120 can be provided in the vacuum region. Further, a conduit 140 (see FIG. 2) can be provided to evacuate the vacuum region.

Specifically, the conduit 140 can have an opening 142. The opening 142 can be arranged in the vacuum region. For instance, the opening 142 can be arranged in the center of the vacuum region. Further, more than one opening 142 can be provided. For instance, the more than one openings can be distributed randomly or regularly over the vacuum region. According to some embodiments described herein, the conduit 140 can be configured to be connected to a suction port for applying a negative pressure to the vacuum region. The conduit 140 can be configured to penetrate the body portion 110. Specifically, the conduit 140 can be configured to provide a fluid communication between vacuum region provided on the first side 112 and another side of the body portion 110, such as a side of the body portion 110 opposite the first side 112 (see, e.g., FIG. 2) or transfers to the first side 112.

Typically, "pressure" can be defined as force per unit area, and can be usually understood as the force exerted by a fluid, such as air or water on a uniform surface. As such, it is positive. Accordingly, the values for the "negative pressures" used herein can be referred to zero bar. However, the term "negative pressure" as used in the context of the present disclosure can refer to a situation in which an enclosed volume, such as the vacuum region, has lower pressure than the surroundings. Any compromise in the divide between this area and the more highly pressurized area around the vacuum region can cause substances to flow inwards. Accordingly, objects located in the more highly pressurized area around the vacuum region can be pulled into the vacuum region by a suction force that can be generated by the negative pressure. In the context of the present disclosure, when referring to a value of the "suction force", the value of the "suction force" acting on an object, such as the substrate 10, can be meant. Specifically, when comparing two or more "suction forces" by their value, the comparison can be understood as relating to the force acting on an object, such as the substrate 10, to move, specifically to pull, the substrate in a direction. In this context, phrases like "a second suction force being larger than a first suction force" can be understood in that the second suction force can employ a stronger pulling force on an object, such as the substrate 10, than the first suction force. In the context of a vacuum region having a certain level of vacuum, the "suction force" generated by the negative pressure can also be understood as the pushing force of the surrounding pushing an object towards the vacuum region. That is, although the term "suction force" is used throughout the present application, the person skilled in the art will understand that a pushing force exerted by the surrounding on an object can be meant. Accordingly, a "negative pressure" can be referred to as "a pressure in a vacuum region, which is below the pressure in the surrounding region", e.g. "a pressure in a vacuum region, which is smaller than atmospheric pressure".

Further, the term "vacuum level" can be understood as a level of vacuum generated by a negative pressure. In this context, a smaller negative pressure can lead to a higher "vacuum level", and vice versa. That is, relations like "a second negative pressure being smaller than a first negative pressure" can be understood as having a corresponding second vacuum level being higher than a corresponding first vacuum level. Specifically, the pressure in the vacuum region can be lower when a higher vacuum level is applied.

Figure 2:
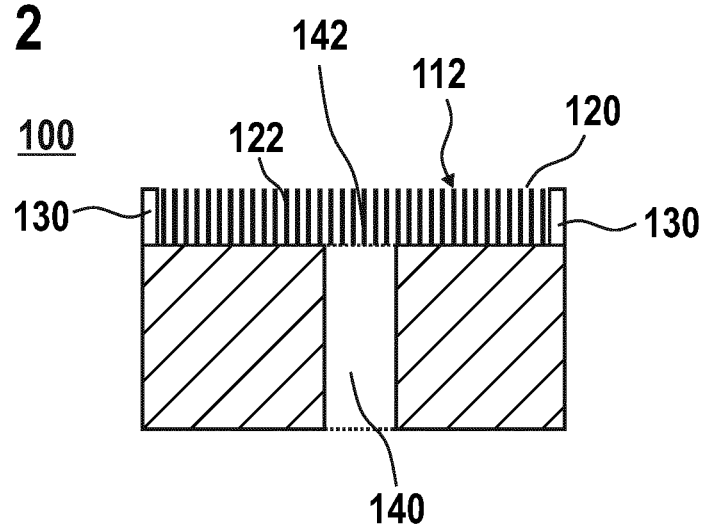
FIG. 2 shows a schematic cross-sectional view of a holding arrangement for holding a substrate according to embodiments described herein.

FIG. 2 shows a schematic cross-sectional view of a holding arrangement 100 according to embodiments described herein facing a substrate 10.

As shown in FIG. 2, the holding arrangement 100 can be provided facing a substrate 10. Specifically, the holding arrangement 100 can be provided in a manner that the first side 112 of the body portion 110 faces the substrate 10. Specifically, the holding arrangement 100 can be arranged with the dry adhesive material 120 facing the substrate 10.

According to some embodiments described herein, the dry adhesive material 120 can be a gecko adhesive, such as a gecko tape or gecko element. In the context of the present disclosure, "gecko adhesive" can be understood as an adhesive that mimics the ability of geckos' feet to adhere to surfaces, such as for example vertical surfaces. Specifically, the dry adhesive material 120 can be configured to adhere to the substrate 10 due to van der Waals forces between the dry adhesive material 120 and a surface of the substrate 10. However, the present disclosure is not limited thereto, and other adhesives suitable for holding the substrate 10 can be used.

According to some embodiments described herein, the dry adhesive material 120 can be a synthetic setae material. The adhesive capabilities of the dry adhesive material 120, specifically of the synthetic setae material, can be related to the adhesive properties of a gecko foot. The natural adhesive capability of the gecko foot allows the animal to adhere to many types of surfaces under most conditions. The adhesive capability of the gecko foot is provided by numerous hair-type extensions, called setae, on the feet of the gecko. It is noted here that the term "synthetic setae material" can be understood as a synthetic material which emulates the natural adhesive capability of the gecko foot and which includes similar adhesive capabilities to the gecko foot. Moreover, the term "synthetic setae material" can be synonymously used with the term "synthetic gecko setae material" or with the term "gecko tape material". However, the present disclosure is not limited thereto and other dry adhesive materials suitable for holding the substrate 10 can be used.

The dry adhesive material 120, for example the synthetic setae material, can be inorganic. According to some embodiments described herein, the dry adhesive material 120 can be substantially 100% inorganic. Moreover, the microstructure of the dry adhesive material 120 can include nanotubes. According to some embodiments described herein, the microstructure of the dry adhesive material 120 includes carbon nanotubes.

As illustrated in FIG. 2, the dry adhesive material can include a plurality of filaments 122 (for illustration purpose only one filament is marked by reference sign 122 in FIG. 2). For instance, the filaments 122 can be nanotubes or carbon nanotubes. Each of the plurality filaments 122 can be a substantially longitudinal member. Specifically, each of the plurality filaments 122 can have one dimension that is larger or substantially larger than the remaining two dimensions. For the sake of reference, the longest dimension of the filaments 122 can be the length of the filament. That is, the filaments can be elongated along a length direction.

Each filament 122 can be attached with one end to the first side 112 of the body portion 110. Specifically, each filament 122 can be attached with one end along the length direction to the first side 112 of the body portion 110. Each filament 122 can extend from the first side 112 of the body portion 110. Specifically, each filament 122 can extend from the first side 112 of the body portion 110 along the length direction. That is, each filament 122 can have second side that is free of an attachment to the body portion 110, specifically to the first side 112 of the body portion. The second side of each filament 122 can extend away from the body portion 110, specifically to the first side 112 of the body portion 110. The second side of each filament 122 can be opposite the first side of the respective filament 122, specifically along the length direction.

According to some embodiments disclosed herein, the second side of each filament 122 can be configured to be attachable to the substrate 10. Specifically, the second side of each filament 122 can be configured to adhere to the substrate 10 by van der Waals forces as outlined herein.

As further shown in FIG. 2, the seal 130 can be arranged along a circumference of the body portion 110, specifically of the first side 112 of the body portion. The seal 130 can be attached to the body portion 110 with a first side. A second side of the seal 130 can extend away from the body portion 110, specifically along the length direction of the filaments 122. According to some embodiments described herein, the seal 130 can have a height that corresponds to or substantially corresponds to the length of the filaments 122.

Although the seal 130 is shown in FIGS. 1 and 2 so as to surround the dry adhesive material 120, dry adhesive material 120 can also be provided in an area that is not surrounded by the seal 130. For instance, a first portion of the dry adhesive material 120 can be arranged within an area delimited by the seal 130 and a second portion of the dry adhesive material 120 can be arranged outside the area delimited by the seal 130. Specifically, the seal 130 can delimit the vacuum region. According to some embodiments described herein, the seal 130 can seal the vacuum region from a surrounding environment, specifically when the seal is in contact with the substrate 10.

According to embodiments described herein, the seal 130 can include the same material as the dry adhesive material 120. Further, the seal 130 can be made of different material as the dry adhesive material 120. For instance, the seal 130 can include and/or be made of material such as silicone, PEEK (polyether ether ketone), and/or any other suitable material.

Figure 3A:
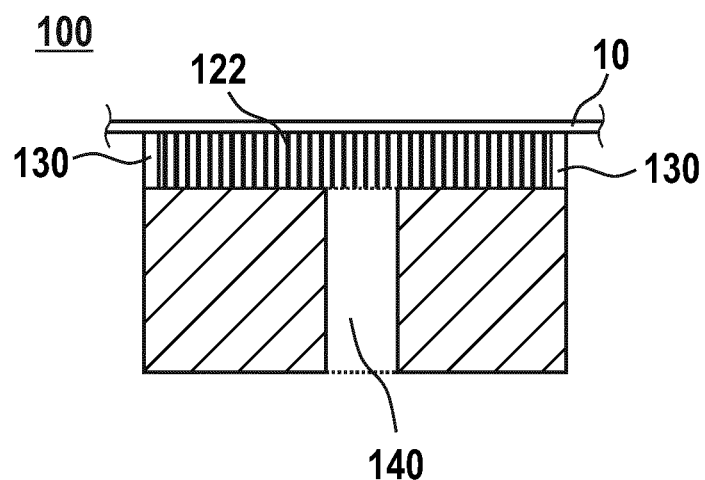
FIG. 3A shows a schematic view of a holding arrangement for holding a substrate according to embodiments described herein.

FIG. 3A shows a schematic view of a holding arrangement 100 for holding a substrate 10 according to embodiments described herein, wherein the substrate 10 is attached to the holding arrangement 100.

Specifically, the substrate 10 and/or the holding arrangement 100 can be configured to be movable relative to each other. Specifically, the substrate and/or the holding arrangement 100 can be brought into close proximity to each other. According to embodiments described herein, the dry adhesive material 120 can be configured to attach the substrate 10 to the body portion 110 under appliance of a first negative pressure p1 to the vacuum region. By applying the first negative pressure p1 to the vacuum region, a first vacuum level can be generated in the vacuum region. Specifically, the first negative pressure p1 can be equal to or smaller than 1 bar.

According to embodiments described herein, the first negative pressure p1 can generate a first suction force F1. The first suction force F1 can pull the substrate 10 towards the holding arrangement 100. Specifically, the first suction force F1 can pull the substrate 10 towards the holding arrangement 100 to bring the substrate 10 into contact with the dry adhesive material 120. When the substrate 10 contacts the dry adhesive material 120, the substrate 10 can be attached to the holding arrangement 100 by the adhesive force of the dry adhesive material 120. That is, the first negative pressure p1 can be used to generate the first suction force F1 for pulling the substrate 10 and/or the holding arrangement 100 in the direction of the other one of the substrate 10 and the holding arrangement 100 so that the dry adhesive material 120 can attach the substrate.

According to embodiments described herein, the first negative pressure p1 and/or the first suction force F1 can be turned off when and/or once the attachment of the substrate 10 and the holding arrangement 100 has been established. According to embodiments described herein, the adhesive force provided by the dry adhesive material 120 can be sufficient for holding the substrate 10. Specifically, the adhesive force provided by the dry adhesive material 120 can be, for instance, about 5 N/cm$^2$, e.g. for horizontally holding a polymer material. Having the substrate 10 attached to the holding arrangement 100 substantially, the processing of the substrate 10 can be performed. For instance, the substrate 10 can be moved through vacuum processing chamber.

As outlined herein, the seal 130 can be configured to provide the vacuum region on the first side 112 of the body portion 110. Specifically, the seal 130 can delimit the region that is evacuated by the first negative pressure p1, i.e. the vacuum region. Further, the size of the vacuum region and/or the size of the negative pressure applied to the vacuum region can be adapted and/or set to predetermined values to generate a suction force. Specifically, the larger the vacuum region gets, the higher the negative pressure has to be for generating the same suction force, and vice versa.

According to embodiments described herein, the attachment of the substrate 10 and the holding arrangement 100 as outlined herein can be performed under non-vacuum conditions. "Non-vacuum conditions" as used herein can be understood as any environmental conditions that have a certain pressure distinct from the vacuum level. For instance, "non-vacuum conditions" can be understood as atmospheric conditions, such as atmospheric pressure, or substantially atmospheric conditions, such as substantially atmospheric pressure. Further, "non-vacuum conditions" can be understood to distinguish from "vacuum conditions", meaning that under "non-vacuum conditions" there is higher pressure than under "vacuum conditions".

Figure 3B:
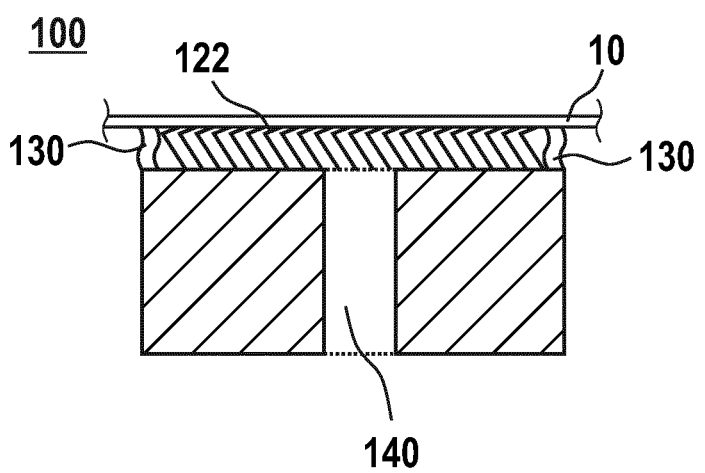
FIG. 3B shows a schematic view of a holding arrangement for holding a substrate according to embodiments described herein.

FIG. 3B shows a schematic view of a holding arrangement 100 for holding a substrate 10 according to embodiments described herein, wherein the substrate 10 is released from the holding arrangement 100.

Having the substrate 10 attached to the holding arrangement 100 by the adhesive force of the dry adhesive material 120, the substrate 10 can be released from holding arrangement 100, specifically after processing of the substrate 10. For instance, a moving member can be provided for pushing the substrate 10 away from holding arrangement 100. However, such a moving member involves additional elements and costs. Further, by pushing the substrate away from the holding arrangement 100 by such a moving member, mechanical stress can be induced in the substrate 10.

According to embodiments described herein, the dry adhesive material 120 can be configured to release the substrate 10 from the body portion 110 under appliance of a second negative pressure p2 to the vacuum region. By applying the second negative pressure p2 to the vacuum region, a second vacuum level can be generated in the vacuum region. Specifically, the force with which the substrate is pressed onto the dry adhesive material 120, can be increased. That is, by adding second suction force F2, which can be generated by the second negative pressure p2, to the adhesive force of the dry adhesive material 120, the substrate 10 can be released from the holding arrangement 100. The substrate 10 can be released from the holding arrangement 100, specifically the dry adhesive material 120, with reduced mechanical stress. When practicing some embodiments describe herein, damage or breakage of the substrate can be prevented. Further, no additional parts are needed for releasing the substrate from the holding arrangement. Specifically, the second negative pressure p2 can be equal to or smaller than the first negative pressure p1, and/or equal to or larger than zero bar.

According to embodiments described herein, the second negative pressure p2 can be applied to increase the force with which the substrate 10 is pressed onto the dry adhesive material 120. According to embodiments described herein, the second negative pressure p2 can be smaller than the first negative pressure p1, i.e. the value of the first second negative pressure p2 can be closer to zero than the value of the first negative pressure p1. In particular, the relation 1 bar>p1>p2>0 bar can hold true. Specifically, the second suction force F2 can be larger than the first suction force F1. The substrate 10 can be moved, specifically by the second negative pressure p2, towards the holding arrangement 100, specifically towards the body portion 110. For instance, the substrate 10 can be pulled towards the body portion 110 by the second suction force F2, which can be generated by the second negative pressure p2.

According to embodiments described herein, the dry adhesive material 120 can be configured to release the substrate 10 from the body portion 110 by moving the substrate in the direction of the body portion 110. Specifically, the dry adhesive material 120 can be configured to release the substrate 10 from the body portion 110 by moving the substrate 10 towards the body portion 110. As shown in FIG. 3B, by moving the substrate 10 towards the body portion 110, i.e. closer to the body portion 110, a conformational change can be induced in the dry adhesive material 120. Specifically, the dry adhesive material 120 can be forced to alter a geometric configuration of the dry adhesive material 120. For instance, the filaments 122 of the dry adhesive material 120 can be buckled. By altering the geometric configuration of the dry adhesive material 120, specifically by buckling the filaments 122 of the dry adhesive material 120, the adhesive force of the dry adhesive material 120 can be altered. For instance, the adhesive force of the dry adhesive material 120 acting on the substrate can be altered. Specifically, the adhesive force of the dry adhesive material 120 acting on the substrate can be lowered.

In the context of the present disclosure, the term "conformational change" can be understood as a change in the shape of a macromolecule. For instance, the term "conformational change" can be understood as a change in the shape of the filaments of the dry adhesive material 120.

When moving the substrate 10 closer to the body portion, the seal 130 can be compressed. According to embodiments described herein, the seal 130 can be flexible. When practicing embodiments described herein, the seal 130 can be crimped under appliance of the second negative pressure, i.e. by the second suction force F2, generating an elastic force of the seal 130. The elastic force of the seal 130 can act in an opposite direction to the second suction force F2. That is, the second suction force F2 can be large enough to overcome the elastic force of the seal 130. Further, when practicing embodiments described herein, the elastic force of the seal 130 can provide a tolerance range for the first suction force F1. Specifically, the elastic force of the seal 130 can work against the first suction force F1 when attaching the substrate 10 to the holding arrangement 100 so that the substrate 10 is not moved too close to the body portion 110. When practicing embodiments described herein, inducing a conformational change of the dry adhesive material 120 during attachment of the substrate can be prevented.

According to embodiments described herein, the release of the substrate 10 from the holding arrangement 100 as outlined herein can be performed under non-vacuum conditions. Further, having the substrate 10 attached to the holding arrangement 100, the seal 130 can provide a sufficient isolation from the environment so that a sufficient suction force can be generated in the vacuum region, enabling release of substrate 10 from the holding arrangement 100 under vacuum conditions.

Figure 4:
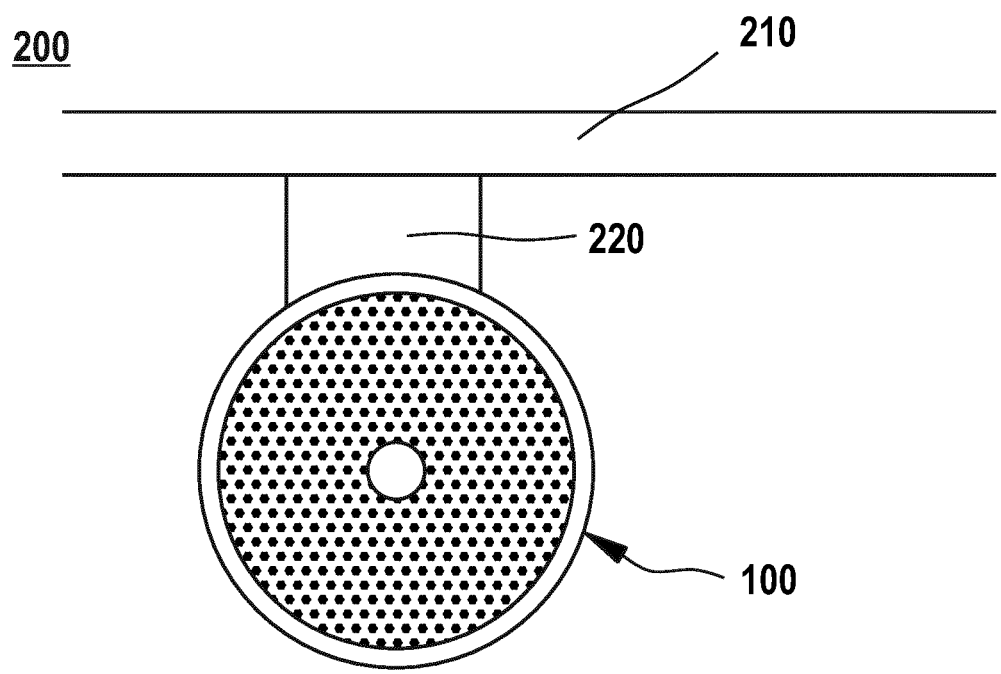
FIG. 4 shows a schematic top view of a carrier for supporting a substrate according to embodiments described herein.
Figure 5:
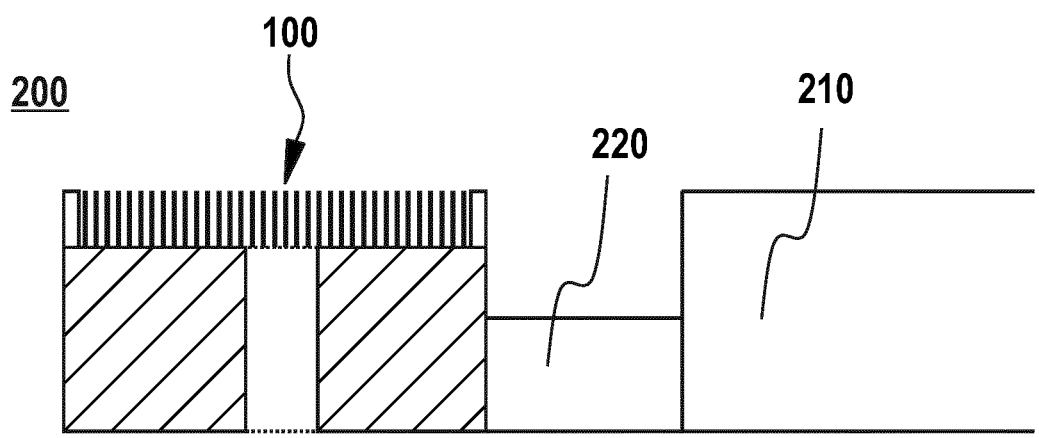
FIG. 5 shows a schematic cross-sectional view of a carrier for supporting a substrate according to embodiments described herein.
Figure 6:
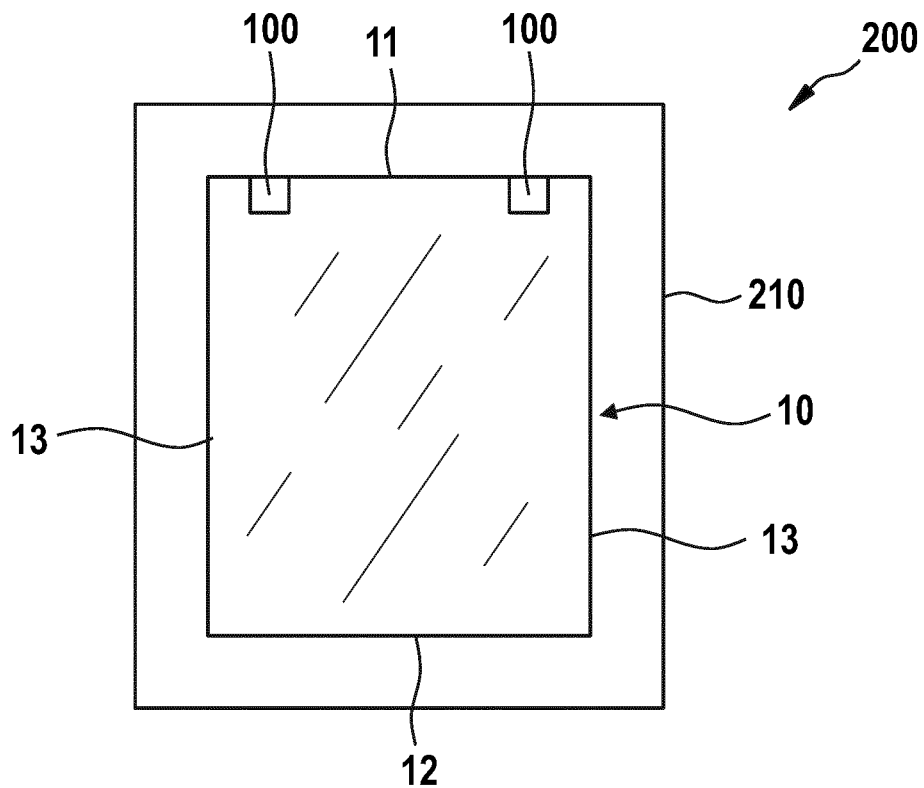
FIG. 6 shows a schematic top view of a carrier for supporting a substrate according to embodiments described herein.
Figure 7:
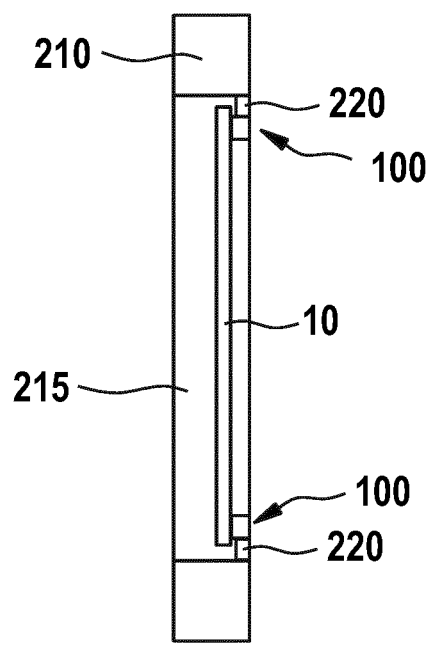
FIG. 7 shows a schematic side view of a carrier for supporting a substrate according to embodiments described herein.

FIGS. 4 and 5 show a schematic top detail view and a schematic cross-sectional detail view, respectively, of a carrier 200 for supporting a substrate 10 according to embodiments described herein. FIGS. 6 and 7 show a schematic top view and a schematic side view, respectively, of a carrier 200 for supporting a substrate 10 according to embodiments described herein. Specifically, FIGS. 4 and 5 show schematic detail views of the part of the carrier 200 indicated by a dashed circle in FIG. 6.

The carrier 200 can include a carrier body 210 and one or more holding arrangements. Specifically, the one or more holding arrangements can be the holding arrangements 100 as described herein. The one or more holding arrangements 100 can be mounted on the carrier body 210. For instance, each of the one or more holding arrangements 100 can be connected to, specifically mounted to, a support structure 220. The support structure 220 can be connected to, specifically mounted to, the carrier body 210. The one or more holding arrangements 100 can be configured for holding the substrate 10 at the carrier body 210. Specifically, the one or more holding arrangements 100 can use a holding force to hold the substrate 10. The holding force can be substantially parallel to a surface of the substrate 10, specifically when the substrate 10 is in a substantially vertical orientation. The holding force can be provided by the dry adhesive material 120 of the holding arrangement 100.

The carrier 200 can be configured to support the substrate 10 during substrate processing, for example, during a layer deposition process, such as a sputtering process. The carrier body 210 can include, or be, a plate or a frame configured for contacting and/or supporting the substrate 10, for example, using a surface provided by the plate or frame. The carrier body 210 can include and/or be made of aluminum, aluminum alloys, titanium, alloys thereof, stainless steel or the like. According to some embodiments, which can be combined with other embodiments described herein, the carrier body 210 can include two or more elements such as a top bar, sidebars and a bottom bar. The two or more elements can define an aperture opening 215. In some implementations, a masking device can be provided at the carrier 200 to mask one or more portions of the substrate 10. As an example, the masking device can be an edge exclusion mask.

The substrate 10 can have a first surface and a second surface. The first surface and the second surface can be opposite surfaces of the substrate. The first surface can be a backside surface of the substrate 10. As an example, the first surface can be configured to face towards the one or more holding arrangements 100. The second surface can be a front surface of the substrate 10. The second surface can be a surface of the substrate 10 to be processed in a vacuum processing chamber. As an example, the second surface can be configured for layer deposition thereon. According to some embodiments, which can be combined with other embodiments described herein, the dry adhesive material 120 can be configured to contact the first surface of the substrate 10. When practicing some embodiments described herein, a contact with the second surface, e.g., a deposition surface of the substrate 10, can be reduced or avoided. A uniformity of a layer during a deposition process can be improved.

According to some embodiments described herein, the carrier 200 can be configured for holding or supporting the substrate 10 in a substantially vertical orientation, e.g., during a layer deposition process. As an example, the one or more holding arrangements 100 can be configured to hold the substrate 10 in the substantially vertical orientation. As used throughout the present disclosure, "substantially vertical" can be understood particularly when referring to the substrate orientation, to allow for a deviation from the vertical direction or orientation of ±20° or below, e.g. of ±10° or below. This deviation can be provided for example because a substrate support with some deviation from the vertical orientation might result in a more stable substrate position. Yet, the substrate orientation, e.g., during the layer deposition process, can be considered substantially vertical, which can be considered different from the horizontal substrate orientation.

The substrate 10 can have an upper side 11, a lower side 12 and two lateral sides 13 (e.g., a left side and a right side). The upper side 11, the lower side 12 and the two lateral sides 13 can be defined with respect to a vertical orientation of the substrate 10. Likewise, the carrier 200 or carrier body 210 can have an upper side, a lower side and two lateral sides (e.g., a left side and a right side).

In some implementations, the one or more holding arrangements 100 can be mounted on the carrier body 210 to hold at least one of the upper side 11, the lower side 12, and at least one of the two lateral sides 13 of the substrate 10. For instance, one or more holding arrangements 100 (e.g., two holding arrangements) can be provided to hold the upper side 11 and/or one or more holding arrangements 100 (e.g., two holding arrangements) can be provided to hold the lower side 12 and/or two or more holding arrangements 100 can be provided to hold each side of the two lateral sides 13 (e.g., two holding arrangements for the left side and two holding arrangements for the right side).

According to some embodiments described herein, the one or more holding arrangements 100 can be mounted on the carrier body 210 to hold the substrate 10 suspended. Specifically, the one or more holding arrangements 100 can be configured to hold the upper side 11 of the substrate 10. In some implementations, the substrate 10 is only held at the upper side 11. For instance, the carrier 200 can include one or more holding arrangements 100 (e.g., two holding arrangements) only at the upper side of the carrier body 210 to hold the upper side 11 of the substrate 10.

According to some embodiments described herein, the holding arrangement 100 can be configured to contact the substrate 10 only on one surface of the substrate 10. For instance, the holding arrangement 100 can be configured to contact the substrate 10 on the backside of the substrate, i.e. that surface of the substrate 10 that is not processed. Further, the support structure 220 can be provided, specifically mounted, between each of the one or more holding arrangements 100 and the carrier body 210. As shown in FIG. 7, the aperture opening 215 can correspond to or be larger, specifically slightly larger, than a surface area of the substrate 10. When practicing some embodiments described herein, the whole front side of the substrate can be processed. Specifically, some embodiments described herein can be practiced without devices providing edge exclusion.

Figure 8:
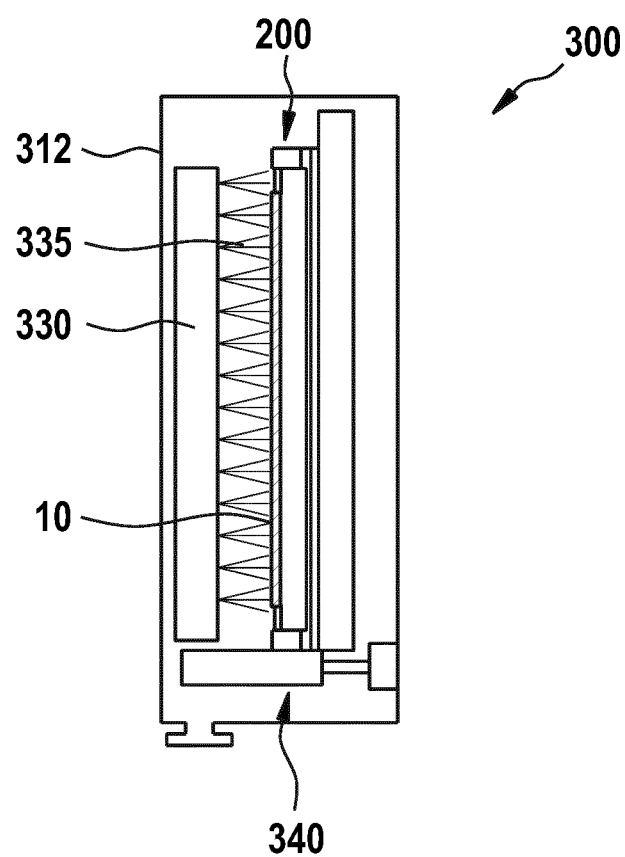
FIG. 8 shows a schematic view of a vacuum processing system according to embodiments described herein.

FIG. 8 shows a schematic view of a deposition system 300 according to embodiments described herein.

The deposition system 300 can include a processing chamber 312, specifically a vacuum processing chamber 312, such as a deposition chamber adapted for a deposition process. The deposition process can be a PVD or CVD process. A carrier 200 can have the substrate 10 positioned thereon. The carrier 200 can be configured according to the embodiments described herein and can have one or more holding arrangements 100. The carrier 200 can be located within or at a support on a substrate transportation device 340.

A deposition material source 330 can be provided in the processing chamber 312 facing the side of the substrate 10 to be processed, e.g. coated. The deposition material source 330 can provide deposition material 335 to be deposited on the substrate 10. The deposition material source 330 can be a target with deposition material thereon or any other arrangement allowing material to be released for deposition on the substrate 10. In some implementations, the deposition material source 330 can be a rotatable target. According to some embodiments described herein, the deposition material source 330 can be movable in order to position and/or replace the deposition material source 330. According to other embodiments described herein, the deposition material source 330 can be a planar target.

According to some embodiments described herein, the deposition material 335 can be chosen according to the deposition process and the later application of the coated substrate. For instance, the deposition material 335 of the deposition material source 330 can be a material selected from the group consisting of: a metal, such as aluminum, molybdenum, titanium, copper, or the like, silicon, indium tin oxide, and other transparent conductive oxides. Oxide-, nitride- or carbide-layers, which can include such materials, can be deposited by providing the material from the deposition material source 330 or by reactive deposition, i.e. the material from the deposition material source 330 can react with elements like oxygen, nitride, or carbon from a processing gas.

A carrier 200 according to some embodiments described herein can be beneficial for stationary processes and also for non-stationary processes. The carrier 200 can hold the substrate 10 in a substantially vertical orientation.

According to embodiments described herein, the deposition system 300 can be implemented in a vacuum processing system. The vacuum processing system can include a swing module. Before attaching the substrate 10 to a holding arrangement 100, a carrier can lie on the swing module. A vacuum connection can be provided from the swing module to the carrier. Specifically, a vacuum connection can be provided from the swing module to the holding arrangement. For instance, a vacuum connection can be provided from the swing module to the suction port of the holding arrangement.

A pin array can be provided on which the substrate 10 can lie on. The substrate 10 can be lowered, specifically by the pin array, onto the holding arrangement 100. When the substrate 10 is lowered onto the holding arrangement 100, a first vacuum level can be applied to the holding arrangement 100, specifically to the vacuum region of the holding arrangement 100. The first vacuum level can be applied, e.g., by the first negative pressure p1. The value of first vacuum level and/or the first negative pressure can be calculated in advance and can be proportional to the force for engaging the holding arrangement 100 with the substrate surface. When an engagement between the holding arrangement 100 and the substrate 10 has been established, the first vacuum level and/or the first negative pressure can be switched off.

Having a stable connection between the holding arrangement 100 and the substrate 10 established, the carrier 200 can be tilted in a vertical direction. The carrier can be inserted into the deposition system 300 for substrate processing, such as layer deposition.

After processing the substrate, the carrier 200 can be moved out of the deposition system 300. The carrier 200 can be tilted back from the vertical direction to the horizontal direction and moved back to the swing module. When the carrier is moved to the swing module, the vacuum connection from the swing module to the holding arrangement can be established again. For releasing the substrate 10 from the holding arrangement 100, the substrate 10 can be pressed closer to the holding arrangement 100. By moving the substrate 10 closer to the holding arrangement 100, buckling of the dry adhesive material 120 can be induced. The adhesive force of the dry adhesive material 120, with which the substrate 10 is attached to the holding arrangement can be reduced, disengaging the holding arrangement 100 from the substrate 10. For instance, the higher force for pressing the substrate closer to the holding arrangement can be generated by a second vacuum level and/or second negative pressure p2. When the substrate 10 has been released from the holding arrangement 100, the substrate 10 can be lifted by the pin array. Further, a robot hand can be provided for exchanging the processed substrate with a substrate to be processed.

Figure 9:
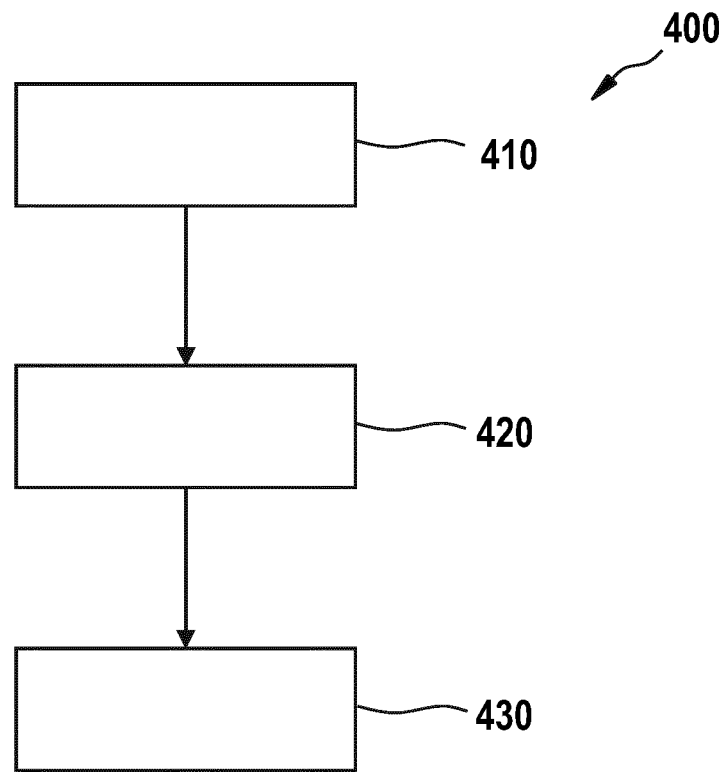
FIG. 9 shows a flow chart of a method for holding a substrate according to embodiments described herein.

FIG. 9 shows a flow chart of a method 400 for holding a substrate according to embodiments described herein. The method 400 can utilize holding arrangements 100 and carriers 200 according to some embodiments described herein. Likewise, holding arrangements 100 and carriers 200 can be configured to implement the method 400 according to the embodiments described herein. Specifically, the method 400 can implement at least one holding arrangement 100 including a dry adhesive material 120.

The method 400 can include, in block 410, applying a first negative pressure p1 to a vacuum region of the at least one holding arrangement 100 for attaching a substrate 10 to the at least one holding arrangement 100. The first negative pressure p1 can generate a first suction force F1 for pulling the substrate 10 in the direction of the at least one holding arrangement.

Further, the method 400 can include, in block 420, moving the substrate through a processing chamber. Specifically, the processing chamber 312 can be a vacuum processing chamber 312 as outlined herein, such as a deposition chamber adapted for a deposition process.

Furthermore, the method 400 can include, in block 430, applying a second negative pressure p2 to the vacuum region of the at least one holding arrangement 100 for releasing the substrate 10 from the at least one holding arrangement 100. The second negative pressure p2 can generate a second suction force F2 for pulling the substrate 10 in the direction of the at least one holding arrangement 100. According to embodiments described herein, the second suction force F2 can be larger than the first suction force F1.

According to some embodiments described herein, the substrate 10 can be moved towards the at least one holding arrangement 100 by appliance of the second negative pressure p2. Specifically, the second negative pressure p2 can be applied to increase the force with which the substrate 10 is pressed onto the dry adhesive material 120. As outlined herein, the adhesive force applied by the dry adhesive material 120 to the substrate 10 can be altered, specifically lowered, by moving the substrate 10 closer to the holding arrangement 100.

Figure 10:
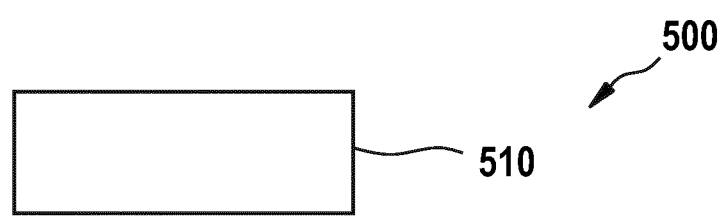
FIG. 10 shows a flow chart of a method for releasing a substrate according to embodiments described herein.

FIG. 10 shows a flow chart of a method 500 releasing a substrate 10 from at least one holding arrangement 100. The method 500 can utilize holding arrangements 100 and carriers 200 according to some embodiments described herein. Likewise, holding arrangements 100 and carriers 200 can be configured to implement the method 500 according to the embodiments described herein.

The method 500 can include, in block 510, increasing the vacuum in a vacuum region of the at least one holding arrangement 100 to increase the force with which the substrate 10 is pressed onto a dry adhesive material 120. Specifically, by increasing the force with which the substrate 10 is pressed onto the dry adhesive material 120, the substrate can be released from the at least one holding arrangement 100.

According to embodiments described herein, the method for holding a substrate and/or the method for releasing a substrate can be conducted by means of computer programs, software, computer software products and the interrelated controllers, which can have a CPU, a memory, a user interface, and input and output devices being in communication with the corresponding components of an apparatus for processing a substrate, such as the deposition system described herein.

The present disclosure can use a suction force acting in the direction of a holding arrangement to release a substrate from the holding arrangement having a dry adhesive material. In particular, a negative pressure can be applied to generate a suction force for pulling the substrate toward the holding arrangement. The dry adhesive material can be detached from the substrate surface with reduced mechanical stress. When practicing some embodiments described herein, damage or breakage of the substrate can be prevented. Specifically, particle generation can be reduced. Furthermore, by using different vacuum levels and/or negative pressures for attaching and/or releasing a substrate, a high rate or number of cycles per time can be achieved when practicing some embodiments described herein. Furthermore, the adhesive can reduce or even prevent a bulging when holding the substrate, e.g., a bulging due to forces that can push the substrate edge towards the center of the substrate. In practice, some embodiments of the present disclosure can hold bigger and thinner substrates without damage or breakage.

While the foregoing is directed to embodiments of the disclosure, other and further embodiments of the disclosure may be devised without departing from the basic scope thereof, and the scope thereof is determined by the claims that follow.

The invention claimed is:

1. An apparatus for processing a substrate, comprising:
   a body portion having a first side;
   a dry adhesive material provided on the first side of the body portion;
   a seal surrounding the dry adhesive material and configured to provide a vacuum region on the first side, wherein the dry adhesive material is provided in the vacuum region;
   a conduit to evacuate the vacuum region; and
   a controller configured to attach a substrate to the body portion under appliance of a first negative pressure to the vacuum region to provide a first suction force to pull the substrate towards the dry adhesive material and to release the substrate from the body portion under application of a second negative pressure to the vacuum region to increase a force with which the substrate is pressed onto the dry adhesive material, wherein the second negative pressure provides a second suction force to pull the substrate towards the dry adhesive material, wherein the second negative pressure is smaller than the first negative pressure so that the second suction force is larger than the first suction force, such that the controller is configured to cause the substrate to release from the body portion by moving the substrate towards the body portion.

2. The apparatus for processing a substrate according to claim 1, wherein the first negative pressure is smaller than about 1 bar and/or wherein the second negative pressure is larger than 0 bar.

3. The apparatus for processing a substrate according to claim 1, wherein the dry adhesive material is a synthetic setae material and/or a Gecko adhesive.

4. The apparatus for processing a substrate according to claim 1, wherein the conduit is configured to be connected to a suction port for applying a negative pressure to the vacuum region.

5. An apparatus for processing a substrate during substrate processing in a vacuum processing chamber, comprising:
   a body portion having a first side;
   a dry adhesive material provided on the first side of the body portion and comprising a plurality of filaments;
   a seal surrounding the dry adhesive material and configured to provide a vacuum region on the first side, wherein the dry adhesive material is provided in the vacuum region;
   a conduit to evacuate the vacuum region; and
   a controller configured to cause the conduit to apply a first negative pressure to the vacuum region to attach the substrate, and to apply a second negative pressure to the vacuum region to move the substrate closer to the body portion to buckle the plurality of filaments, releasing the substrate, wherein the second negative pressure is smaller than the first negative pressure so that a second suction force provided by the second negative pressure to pull the substrate towards the dry adhesive material is larger than a first suction force provided by the first negative pressure to pull the substrate towards the dry adhesive material, such that the controller is configured to cause the substrate to release from the body portion by moving the substrate towards the body portion.

* * * * *